United States Patent [19]

Bailey

[11] 4,028,737

[45] June 7, 1977

[54] TRANSIENT VOLTAGE PROTECTION CIRCUIT

[75] Inventor: Ronald L. Bailey, Rockford, Ill.

[73] Assignee: Barber-Colman Company, Rockford, Ill.

[22] Filed: Apr. 2, 1975

[21] Appl. No.: 564,540

[52] U.S. Cl. .................................. 361/86; 361/111
[51] Int. Cl.² ........................................ H02H 3/20
[58] Field of Search .................. 317/31, 33 SC, 50

[56] References Cited

UNITED STATES PATENTS

| 3,603,843 | 9/1971 | Clements | 317/33 SC |
| 3,769,548 | 10/1973 | Pardue | 317/33 SC X |

*Primary Examiner*—Harry E. Moose, Jr.
*Attorney, Agent, or Firm*—A. Richard Koch

[57] ABSTRACT

A triac controlling current from an AC line to a load is protected against excessive transient voltages on the line by a protection circuit that turns on the triac when excessive positive or negative transient voltages occur so that the resultant power is dissipated in the controlled load.

9 Claims, 1 Drawing Figure

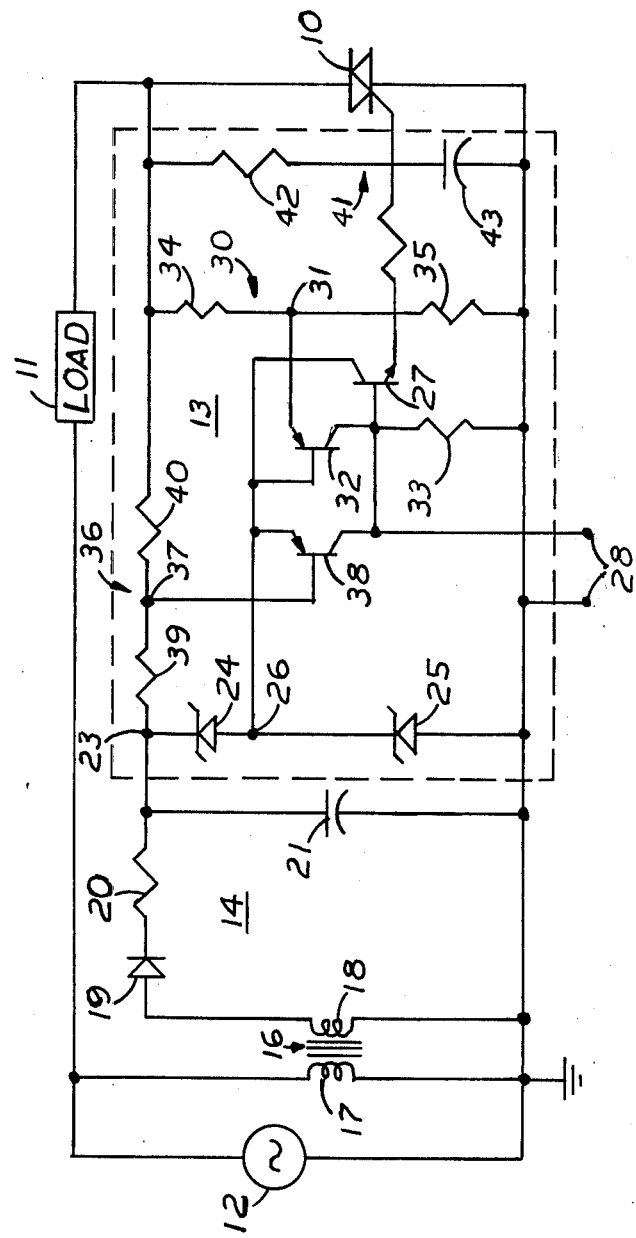

TRANSIENT VOLTAGE PROTECTION CIRCUIT

BACKGROUND OF THE INVENTION

This invention pertains to means for protecting thyristors in non-conducting state from transient high voltage.

It is well known that voltage supplied by power lines contains transient high voltages resulting from lightning, switching of large loads, short circuits and other causes. Such transient voltages, taking the form of very short, sharp peaks when plotted against time, are commonly referred to as spikes. These spikes, or other excessive voltages, may exceed the forward breakover voltage of non-conducting thyristor control devices, employed to selectively connect loads across the line, resulting in destruction of the device.

Because thyristors having sufficiently high breakover voltage to be immune to spikes and the like are expensive, some other form of protection is desirable. If the thyristor is inexpensive, it may be satisfactory to merely replace a destroyed thyristor. Ralph E. Clements in U.S. Pat. No. 3,603,843, issued Sept. 7, 1971, disclosed a method and means whereby a control device could be inexpensively protected by turning it on when near destructive voltages appeared on the power line.

SUMMARY OF THE INVENTION

This invention provides a novel improved method and means for transient protection of a thyristor in non-conductive state by turning it on and dissipating the resultant power in the controlled load before damage can occur to the thyristor.

BRIEF DESCRIPTION OF THE DRAWING

The drawing is a circuit diagram of the preferred embodiment of the transient voltage protection circuit and its connections to external circuitry associated therewith.

DESCRIPTION OF THE PREFERRED EMBODIMENT

As shown in the drawing, a thyristor 10, shown as a triac, is connected to control energization of a load 11 from an AC supply 12. The transient voltage protection circuit 13, enclosed in dashed lines, protects the thyristor from excessive transient voltages appearing on the AC supply. A DC power supply 14 delivers a DC voltage for the protection circuit.

The DC power supply 14 shown comprises a transformer 16 with its primary 17 connected across the AC supply 12. The secondary 18 delivers a low voltage AC, which is rectified by diode 19, passed through voltage dropping resistor 20 and filtered by capacitor 21 before delivery to the protection circuit 13 at supply terminal 23.

In protection circuit 13 a pair of Zener diodes 24, 25 are connected in series between supply terminal 23 and ground, providing at junction 26 a source of regulated DC reference voltage. A switching device 27 is shown as interposed between junction 26 and a gate, or controlling, terminal of thyristor 10 to deliver a turn-on voltage to the thyristor. As shown the switching device is an NPN transistor, the collector of which is connected to the positive source of DC reference voltage at junction 26 and the emitter of which is coupled to the gate of the triac 10. Whenever the switching device is closed, whether in response to an external input signal applied at input terminals 28 or in response to operation of the protective circuit 13, thyristor 10 is fired, permitting current from AC supply 12 to energize load 11.

A voltage divider 30, connected in a circuit paralleling the thyristor 10 between the power and common terminals, provides a control voltage at tap 31. When the control voltage at tap 31 exceeds the DC reference voltage at junction 26, a comparator 32 delivers from an output terminal a signal employed to close the switching device 27. As shown the comparator is a PNP transistor with its emitter connected to tap 31, its base to junction 26 and its collector to the base of transistor 27 and through resistor 33 to ground. The resistors 34, 35 shown as forming the voltage divider 30 are so selected that the control voltage at tap 31 exceeds the DC reference voltage at junction 26 only when a transient voltage, appearing at the power terminal of the thyristor, is positive with respect to the common terminal and exceeds a predetermined value, which value is lower than that which would damage the thyristor.

A second voltage divider 36, connected through Zener dioides 24, 25 in a circuit paralleling the thyristor 10 between its common and power terminals, provides a control voltage at tap 37. When the control voltage at tap 37 is exceeded by the DC reference voltage at junction 26, a comparator 38 delivers from an output terminal a signal employed to close the switching device 27. As shown the comparator is a PNP transistor with its emitter connected to junction 26, its base to tap 37 and its collector to the base of transistor 27. The resistors 39, 40, shown as forming the voltage divider 37, are so selected that the control voltage at tap 37 is exceeded by the DC reference voltage at junction 26 only when a transient voltage appearing at the power terminal of the thyristor 10 is negative with respect to the common terminal and exceeds a predetermined value, which value is lower than that which would damage the thyristor. The voltage divider 36 is biased positive by the DC voltage at supply terminal 23 so that the voltage appearing at tap 37 is more positive than junction 26 under normal conditions.

It will be seen that the thyristor 10 is fired in response to excessive and possibly otherwise thyristor destructive transients of either polarity. The thyristor is thus protected from the imposition between its power and common terminals of thyristor destructive transients, which are dissipated in the load 11.

As an additional protection for thyristor 10, a delay circuit 41 comprising a resistor 42 and capacitor 43 is connected between the power and common terminals of the thyristor as a parallel circuit. The capacitor 43 delays the rise in voltage ($dv/dt$) across the thyristor 10, allowing additional time for the transient voltage protection circuit 13 to fire the thyristor before the voltage across it can rise to destructive amplitude.

In some applications the switching device 27 may be eliminated, the gate of thyristor 10 being connected to the upper end of resistor 33 and using the voltage appearing thereacross as the turn-on voltage. Sometimes even the resistor 33 may be eliminated so that the output of a comparator 32, 38 may be employed to turn-on the thyristor 10.

It will be obvious to those skilled in the art that many substitutions and modifications can be made in the described circuit. For example, an electromagnetic relay could replace the transistor 27 as the switching device. The transistor 27 could be light sensitive, receiving a signal in the form of a light beam controlled by the comparators 32, 38 and input terminals 28. Other sources of DC voltage could be employed. The comparators 32, 38 could be differential amplifiers. The circuit will protect SCRs and other gate turn-on devices as well as triacs. The preferred circuit shown and described is for illustration only and does not define the limits of the invention, which are defined in the claims.

I claim:

1. A transient voltage protection circuit for a thyristor connected through the power and common terminals thereof in series with a load controlled thereby and an AC power supply, said circuit comprising a voltage divider and said thyristor through the power and common terminals thereof in parallel circuits, a tap on the voltage divider providing a control voltage as a function of the instantaneous voltage on said AC supply, a source of regulated DC reference voltage at a magnitude below the control voltage corresponding to a thyristor destructive voltage on said AC supply, a source of turn-on voltage, and means for selectively coupling said thyristor through a gate and the common terminal thereof across the source of turn-on voltage in response to said control voltage exceeding the reference voltage.

2. A transient voltage protection circuit according to claim 1 additionally comprising a bias voltage source in series with the voltage divider in said circuit paralleling the thyristor.

3. A transient voltage protection circuit according to claim 1 additionally comprising a second voltage divider and a bias voltage source in a series circuit, said series circuit and the thyristor through the power and common terminals thereof in parallel circuits, a second tap on said second voltage divider providing a second control voltage as a function of the instantaneous voltage on said AC supply, and second means for selectively coupling said thyristor through the gate and the common terminal thereof across the source of turn-on voltage in response to said DC reference voltage exceeding the second control voltage upon occurrence of an excessive transient voltage of reverse polarity on said AC supply.

4. A transient voltage protection circuit according to claim 1 wherein a comparator receiving inputs from said sources of DC reference and control voltage provides at an output terminal as an output a signal to which said means responds.

5. A transient voltage protection circuit according to claim 4 wherein said means couples the output terminal of said comparator to the gate terminal of said thyristor.

6. A transient voltage protection circuit according to claim 4 wherein said means comprises a switching device connected to deliver the turn-on voltage from the source thereof to said gate terminal of the thyristor in response to a signal received from the output of said comparator.

7. A transient voltage protection circuit according to claim 6, wherein said switching device comprises a transistor.

8. A transient voltage protection circuit according to claim 4 wherein said comparator comprises a transistor.

9. A transient voltage protection circuit according to claim 1 wherein the sources of the DC reference and turn-on voltages are one.

* * * * *